(12) United States Patent
Subbotin (10) Patent No.: US 7,830,426 B2
(45) Date of Patent: Nov. 9, 2010

(54) METHOD AND APPARATUS PROVIDING COLOR INTERPOLATION IN COLOR FILTER ARRAYS USING EDGE DETECTION AND CORRECTION TERMS

(75) Inventor: Igor Subbotin, South Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 779 days.

(21) Appl. No.: 11/319,398

(22) Filed: Dec. 29, 2005

(65) Prior Publication Data

US 2007/0153106 A1    Jul. 5, 2007

(51) Int. Cl.
*H04N 3/14* (2006.01)

(52) U.S. Cl. .................... 348/272; 348/273; 348/252; 382/266

(58) Field of Classification Search .......... 348/272
See application file for complete search history.

(56) References Cited

U.S. PATENT DOCUMENTS

| | | | | |
|---|---|---|---|---|
| 3,971,065 | A | | 7/1976 | Bayer |
| 5,852,475 | A | * | 12/1998 | Gupta et al. ............... 348/606 |
| 6,181,376 | B1 | * | 1/2001 | Rashkovskiy et al. ....... 348/273 |
| 6,570,616 | B1 | * | 5/2003 | Chen ......................... 348/272 |
| 6,614,474 | B1 | * | 9/2003 | Malkin et al. .............. 348/252 |
| 6,674,903 | B1 | * | 1/2004 | Cliquet ...................... 382/199 |
| 6,847,396 | B1 | * | 1/2005 | Lin ............................ 348/273 |
| 7,664,316 | B2 | * | 2/2010 | Aoki .......................... 382/162 |
| 2003/0081465 | A1 | * | 5/2003 | Cho ............................. 365/200 |
| 2003/0086606 | A1 | * | 5/2003 | Hunter et al. ............. 382/167 |
| 2004/0150734 | A1 | * | 8/2004 | Sobel et al. ................ 348/272 |
| 2005/0219390 | A1 | * | 10/2005 | Tajima et al. .............. 348/246 |

OTHER PUBLICATIONS

Ramanath et al, "Demosaicking Methods for Bayer Color Arrays", Journal of Electronic Imaging, vol. 11, No. 3, Jul. 2002, pp. 306-315.

Xiaomeng et al., "Demosaicing with Improved Edge Direction", Circuits and Systems, EIII International Symposium on Kobe, Japan, May 23-26, 2005, pp. 2048-2052.

Chang et al, "Color Filter Array Recovery Using a Threshold-Based Variable Number of Gradients", Proceedings of the SPIE, Bellingham, VA, vol. 3650, Jan. 25, 1999, pp. 36-43.

Kehtarnavaz et al., "Color Filter Array Interpolation Using Color Correlations and Directional Derivatives", Journal of Electronic Imaging, SPIE, vol. 12, No. 4, Oct. 2003, pp. 621-632.

Altunbasak et al., "Demosaicking: Color Filter Array Interpolation [exploring the imaging process and the correlations among three color planes in single-chip digital cameras]", IEEE Signal Processing Magazine, vol. 22, No. 1, Jan. 2005, pp. 44-54.

Aleksic et al, "Local Correlation Based CFA Interpolations", IEEE, Canadian Conference on Niagara Falls, May 2-5, 2004, vol. 2, pp. 793-796.

Gunturk et al., Color Plane Interpolation Using Alternating Projections, IEEE Transactions on Image Processing, vol. 11, No. 9, Sep. 2002, pp. 997-1013.

Austrian Written Opinion, Mar. 13, 2009.

* cited by examiner

*Primary Examiner*—Sinh Tran
*Assistant Examiner*—Paul Berardesca
(74) *Attorney, Agent, or Firm*—Dickstein Shapiro LLP (57) ABSTRACT

A method and apparatus for color plane interpolation are provided which interpolates the color values of pixels differently depending on an edge direction and whether a pixel is at an edge within an image. The use of the edge detection during the interpolation of each of the colors present in the color pattern helps reduce some of the disadvantages of the loss of image sharpness abundant in known demosaicing techniques.

34 Claims, 8 Drawing Sheets

METHOD AND APPARATUS PROVIDING COLOR INTERPOLATION IN COLOR FILTER ARRAYS USING EDGE DETECTION AND CORRECTION TERMS

The present invention relates to demosacing for use on an image captured by an image sensor.

BACKGROUND OF THE INVENTION

Image sensors, also known as imagers, were developed in the late 1960s and early 1970s primarily for television image acquisition, transmission, and display. An imager absorbs incident radiation of a particular wavelength (such as optical photons, x-rays, or the like) and generates an electrical signal corresponding to the absorbed radiation. There are a number of different types of semiconductor-based imagers, including charge coupled devices (CCDs), photodiode arrays, charge injection devices (CIDs), hybrid focal plan arrays, and CMOS imagers.

These imagers typically consist of an array of pixels containing photosensors, where each pixel produces a signal corresponding to the intensity of light impinging on that element when an image is focused on the array. These signals may then be stored, for example, to display a corresponding image on a monitor or otherwise be used to provide information about the optical image. The photosensors are typically phototransistors, photoconductors or photodiodes. The magnitude of the signal produced by each pixel, therefore, is proportional to the amount of light impinging on the photosensor.

To allow the photosensors to capture a color image, the photosensors must be able to separately detect, for example when using a Bayer pattern, red (R) photons, green (G) photons and blue (B) photons. Accordingly, each pixel must be sensitive only to one color or spectral band. For this, a color filter array (CFA) is typically placed in front of the pixels so that each pixel measures the light of the color of its associated filter. Thus, each pixel of a color image sensor is covered with either a red, green or blue filter, according to a specific pattern (e.g., Bayer pattern).

For most low cost CMOS or CCD image sensors, the color filters are integrated with the sensors. A common example of a color filter pattern is the tiled color filter array illustrated in U.S. Pat. No. 3,971,065, (the disclosure of which is incorporated by reference herein) and commonly referred to as "the Bayer pattern" color filter.

Figure 1:
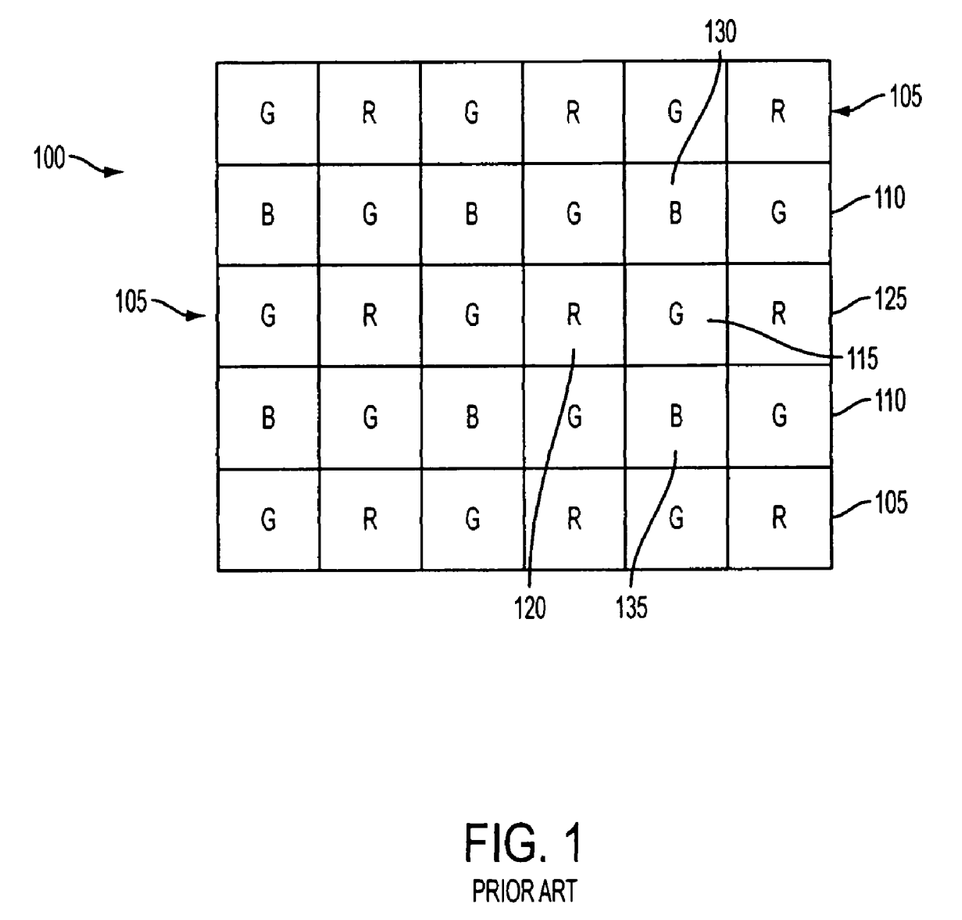
FIG. 1 is a top-down illustration of a conventional color filter array.

As shown in FIG. 1, the Bayer pattern 100 is an array of repeating red (R), green (G), and blue (B) filters causing pixels underneath the filters to be red, blue, and green pixels, respectively. In the Bayer pattern 100, red, green and blue pixels are arranged so that alternating red and green pixels are on a first row 105 of an array, and alternating blue and green pixels are on a next row 110. These alternating rows are repeated throughout the array. Thus, when the image sensor is read out, line by line, the pixel sequence for the first line reads GRGRGR etc., and then the alternate line sequence reads BGBGBG etc. This output is called sequential RGB or sRGB.

In the Bayer pattern 100, sampling rates for all three basic colors are adjusted according to the acuity of the human visual system. That is, green color, to which the human eye is most sensitive and responsive, is sensed with a larger number of sensors, whereas blue and red color, for which the human vision has less resolution, are sensed with a fewer number of sensors. This is why in the Bayer pattern, the green-sensitive elements occur at every other array position, while the red-sensitive elements and the blue-sensitive elements occur at every fourth array position.

Figure 2:
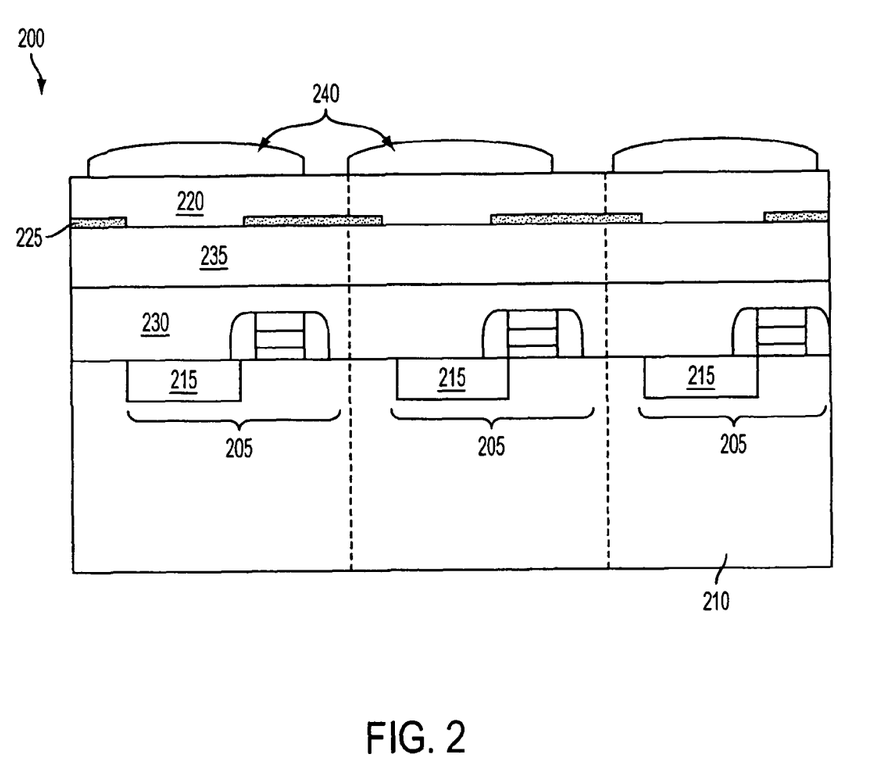
FIG. 2 is a cross-sectional view of a portion of a pixel array having a color filter array.

As shown in FIG. 2 in a solid state image sensor, the Bayer patterned filters may be formed over an array 200 of pixel sensors 205. Specifically, an array 200 of pixel sensors 205 is formed on a semiconductor substrate 210. Each pixel sensor 205 has a photosensitive element 215, which may be any photon-to-charge converting device, such as a photogate, photoconductor or photodiode. The color filter array 220 may be formed over an upper level metal layer 225 in the array 200, separated from the photosensors 215 by various metallization and insulating layers such as an interlevel dielectric layer (ILD) 235 containing insulator metallization patterns and a passivation layer 230. The metal layer 225 may be opaque and used to shield the areas of the pixels that are not light sensitive. Convex lenses 240 are formed over the color filters 220. In operation, incident light is focused by the lenses 240 through the filters 220 to the photosensitive element 215.

For a Bayer pattern filter, values for red, green and blue are necessary for each pixel. Since each pixel sensor cell is only sensing one color, values for the remaining two colors are calculated by interpolation from the neighboring pixels that are sensing the missing colors. This color plane interpolation is known as demosaicing. For example, with reference to FIG. 1, pixel sensor cell 115 is associated with a green filter, which causes pixel sensor cell 115 to sense green light and produce a signal which represents only green light. In order to obtain an approximation of the amount of red and blue light for pixel sensor cell 115, a value may be interpolated from the neighboring red pixel sensor cells 120 and 125 and the neighboring blue pixel sensor cells 130 and 135, respectively. If demosaicing is not performed correctly, the resulting image may suffer from the inclusion of highly visible color artifacts.

The article entitled "Color Plane Interpolation Using Alternating Projections" published in the IEEE Transactions on Image Processing, Vol. II, No. 9 in September 2002 and written by Bahadir K. Gunturk, Yucel Altunbasak and Russell M. Mersereau (the disclosure of which is incorporated by reference herein) compares several demosaicing techniques. As described each of these demosaicing techniques have their respective advantages and disadvantages.

As described, for each pixel, the value used for a first color is based on a sensed color (i.e., the light sensed by the pixel's sensor 205) and the values for the remaining two colors are based on an interpolated value from the sensed values of corresponding neighboring pixels. Each of the sensed values are representative of the color value at the center of the pixel. Each of the interpolated color values are also representative of the value at the center of the pixel. The interpolated signal is inherently of a lower quality than the originally sensed signal. For example, an interpolated red color value at the center of a pixel would be different than a sensed red color value for the center of the same pixel.

Demosaicing methods, which typically only reconstruct the missing color components, may result in artifacts such as so-called zipper effects and random color dots. Additionally, there exists a trade off between filtering for noise and the blurring of sharp edges. Interpolating a pixel using the surrounding pixel values tends to blur the image when pixels at an edge are interpolated. Furthermore, this also leads to a decrease in the sharpness of the image at the edges. This is mainly due to the averaging of pixels which are across an edge contained within the image. The demosaicing method averages pixels so that a pixel at an edge does not have the sharpness desired of an edge pixel. Accordingly, there is a desire and need for color plane interpolation that provides improved demosaicing techniques that detect and account for image edges when calculating interpolation values.

BRIEF SUMMARY OF THE INVENTION

A method and apparatus for color plane interpolation are provided which interpolates the color values of pixels differently depending on an edge direction and whether a pixel is at an edge within an image. The use of the edge detection during the interpolation of each of the colors present in the color pattern helps reduce some of the disadvantages of the loss of image sharpness abundant in known demosaicing techniques.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion. The following detailed description is, therefore, not to be taken in a limiting sense, and the scope of the present invention is defined by the appended claims.

It should be understood that reference to a CMOS imager in accordance with the present invention is made for the sole purpose of describing just one example of the present invention. It should be readily apparent that the present invention is not limited to CMOS imagers, but also applies to CCD and other imagers that employ color filters over pixels. Additionally, the current invention is described using a standard three color Bayer pattern. It should be understood that the present invention is not limited to the standard three color Bayer pattern but may be applied to color spaces which use different colors or which use more, or less, than three colors.

Figure 3A:
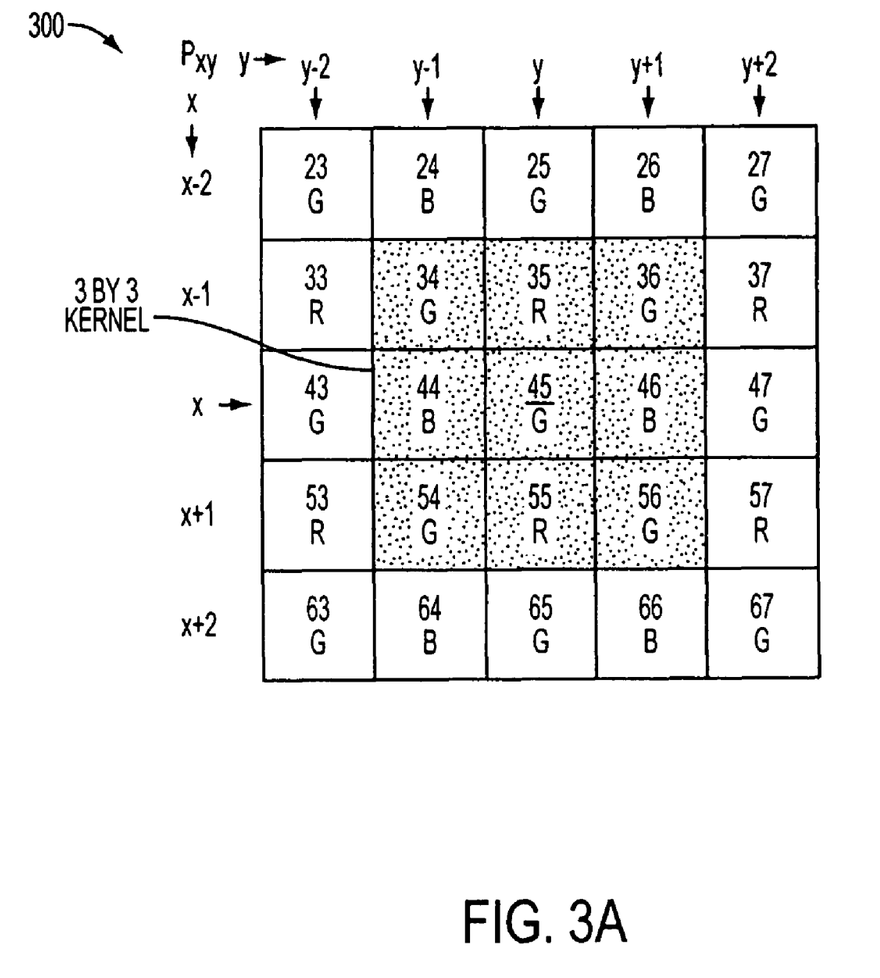
FIGS. 3A-B are exemplary top views of a five by five pixel kernel used in an exemplary interpolation scheme of the present invention.
Figure 3B:
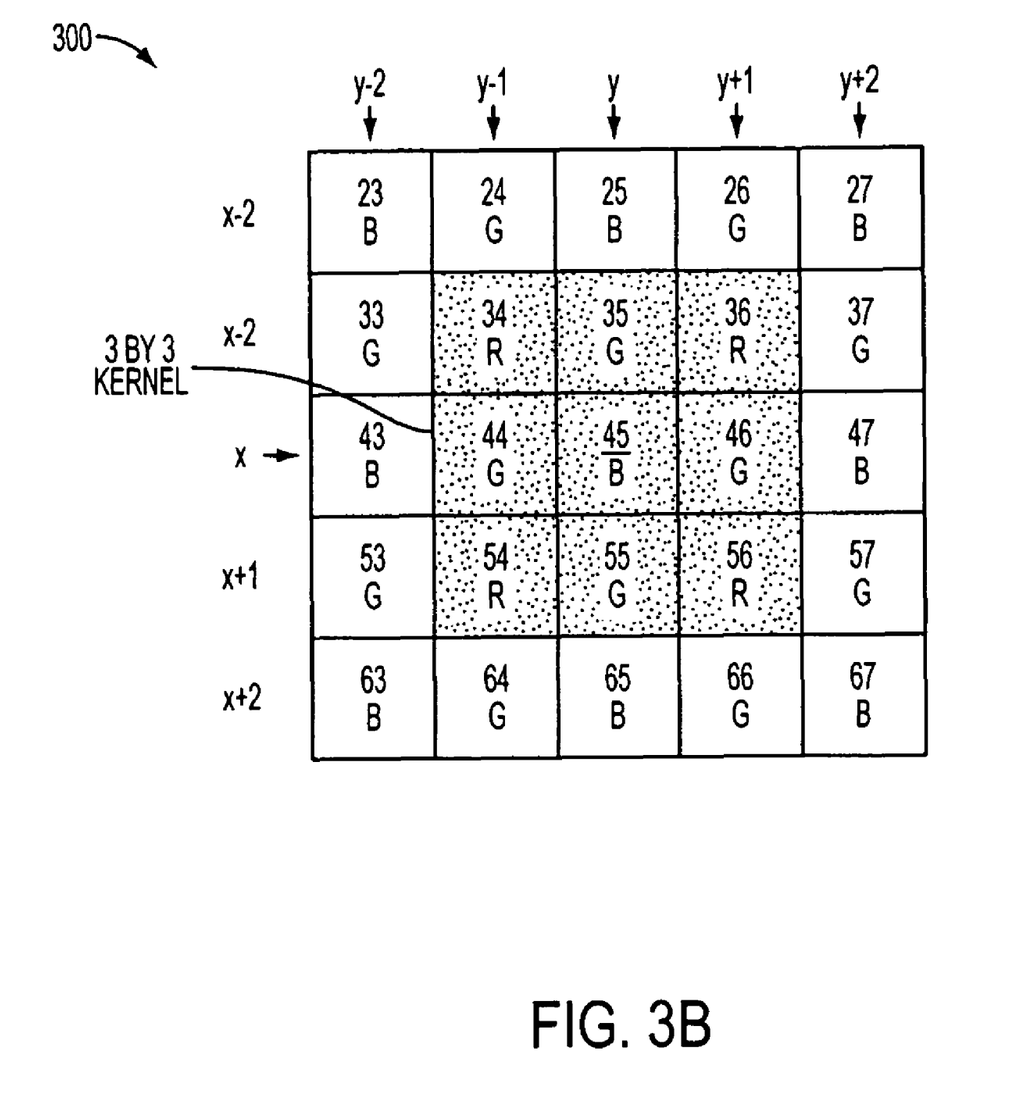

FIGS. 3A, 3B are top-down illustrations of a partial pixel array 300 of an imager in accordance with embodiments of the invention. Specifically, FIGS. 3A, 3B illustrate a five by five kernel (discussed below in more detail) used in the present invention. As previously noted, each pixel, e.g., pixel 23, senses a single color. Accordingly, each green (G) pixel provides a sensed value for green. Similarly, each blue (B) pixel provides a sensed value for blue and each red (R) pixel provides a sensed value for red. For each pixel of a particular color, the values for each of the remaining colors is interpolated to reconstruct the color image. Additionally, as discussed below, the sensed pixel value may also be replaced by an interpolated value. Interpolation of the red, green and blue values eliminate the imbalance resulting from the use of sensed values for one of the colors and interpolated values of the remaining two colors (prevalent in prior art systems).

As shown in FIGS. 3A, 3B for a particular pixel 45 being processed, the five by five kernel of surrounding pixels is used in the following interpolation calculations, though in many of the interpolation calculations only pixels in the three by three kernel are needed. However, other kernel sizes may also be employed in the invention.

Generally, for each selected pixel, a three by three interpolated kernel, within the five by five kernel, is first defined and color values for the pixel within the kernel are then calculated. Next, an edge direction is determined. Depending on the pixel color and the edge direction, some values of the three by three kernel may be recalculated. The three by three kernel is then used to determine whether an edge is present for the selected pixel. Then, based on whether an edge is present and the pixel color, interpolation values are calculated. Different interpolation parameters are applied in the interpolation process based on whether a processed pixel is at an image edge, as well as the sensed color of the pixel.

Figure 4:
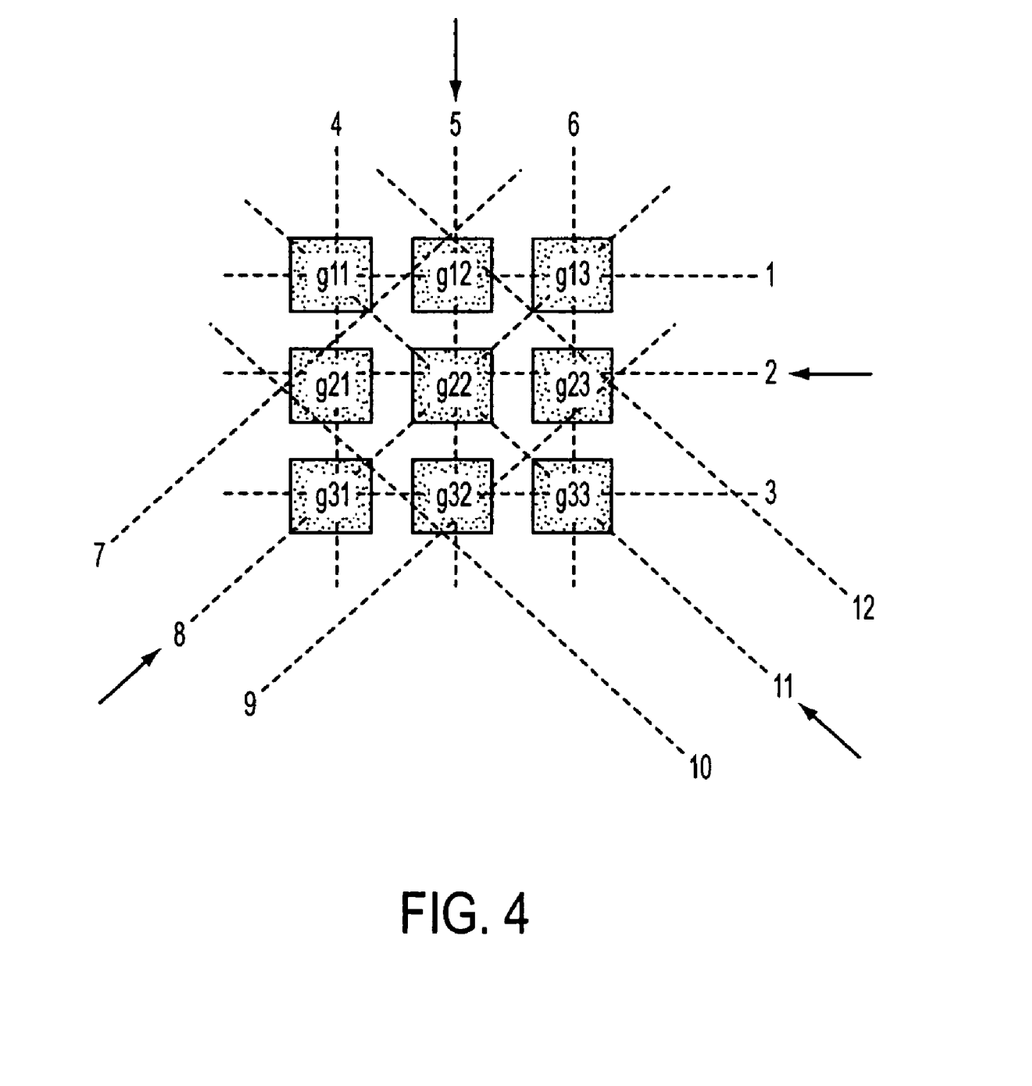
FIG. 4 is a block diagram of a three by three kernel that is used in accordance with an exemplary embodiment of the invention.
Figure 7:
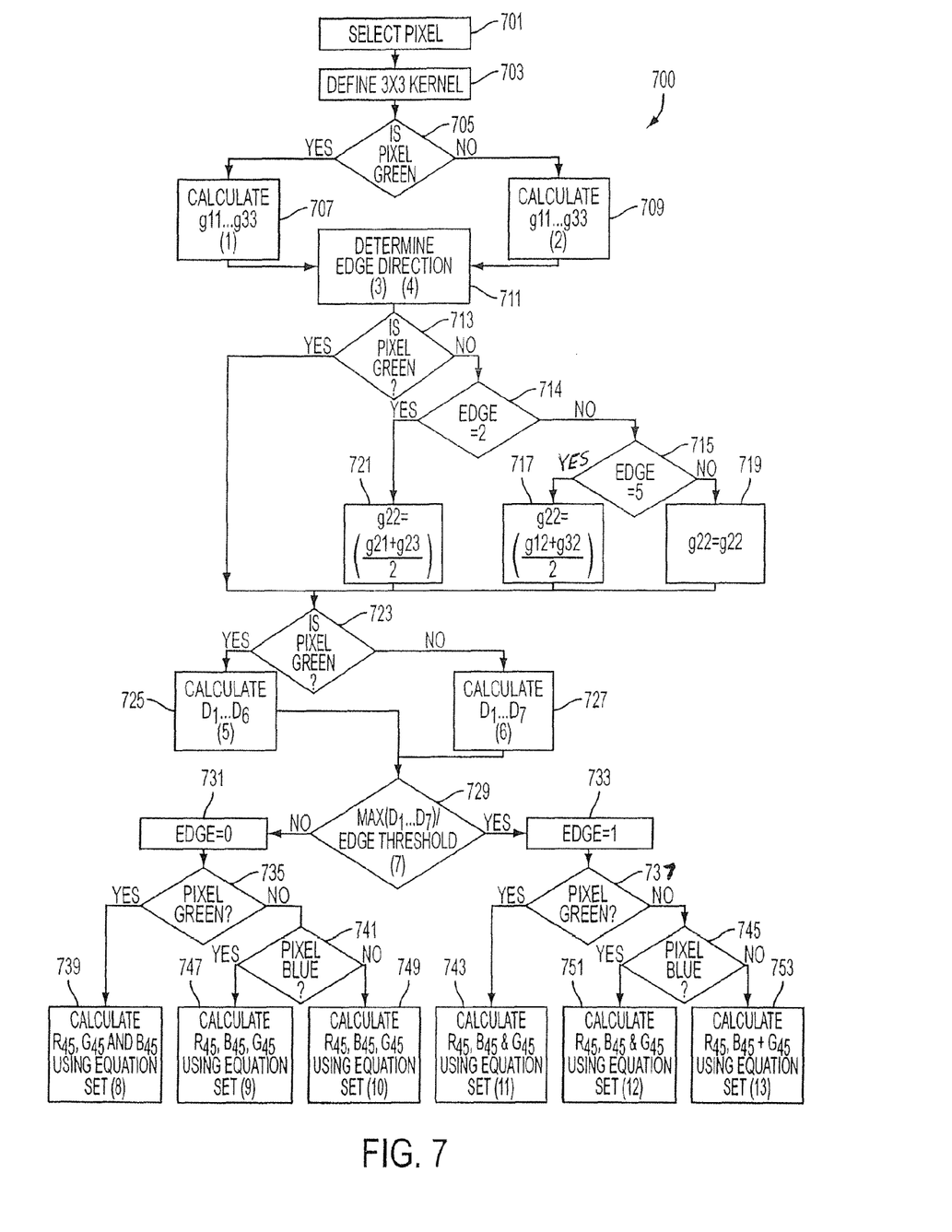
FIG. 7 is a flow chart illustrating the process of one embodiment of the present invention.

The interpolation process of the invention can be more clearly understood from the FIG. 7 flow chart which illustrates the overall interpolation process. In step 701, a pixel is selected for processing. Throughout the description representative pixel 45 illustrated in FIGS. 3A, 3B and as the center pixel in FIG. 4, is used as the exemplary pixel being processed. Next in step 703, the three by three kernel surrounding the selected pixel is defined (e.g., pixels 34, 35, 36, 44, 45, 46, 54, 55, and 56 in FIGS. 3A and 3B). In step 705 it is determined whether pixel 45 is a sensed green pixel. If pixel 45 is green, in step 707 the green values for the three by three kernel are calculated in accordance with equation set (1) below using actual sensed pixel values from the pixels within the three by three kernel. FIG. 4 illustrates the locations within the three by three kernel for the calculated green values g11, g12, g13, g21, g22, g23, g31, g32, g33 for pixels within the three by three kernel. The three by three kernel is calculated using the actual values of green pixels 25, 34, 36, 45, 47, 54, 56 and 65 illustrated in FIG. 3A. The three by three kernel is calculated using the following equations:

$$\begin{aligned}
g11 &= P_{34}; \\
g12 &= \text{MEDIAN}(P_{25}, P_{34}, P_{45}, P_{36}) \\
g13 &= P_{36}; \\
g21 &= \text{MEDIAN}(P_{56}, P_{47}, P_{45}, P_{36}) \\
g22 &= P_{45}; \\
g23 &= \text{MEDIAN}(P_{56}, P_{65}, P_{45}, P_{54}); \\
g31 &= P_{54}; \\
g32 &= \text{MEDIAN}(P_{43}, P_{34}, P_{45}, P_{54}); \text{ and} \\
g33 &= P_{56},
\end{aligned} \quad (1)$$

where "P" is the pixel value and "xy" is the pixel number shown in FIGS. 3A-B. As shown in FIGS. 3A-B, "x" delineates the row and "y" delineates the column. If pixel 45 is either red or blue as shown in FIG. 3B, in step 709, the three by three kernel is calculated using the values of green pixels 24, 26, 33, 35, 37, 44, 46, 53, 55, 57, 64 and 65 in accordance with equation set (2) below. The three by three green kernel is then calculated using the following equations:

$$\left.\begin{aligned}g11 &= \text{MEDIAN } (P_{33}, P_{24}, P_{35}, P_{44}); \\ g12 &= P_{35}; \\ g13 &= \text{MEDIAN } (P_{26}, P_{37}, P_{35}, P_{46}); \\ g21 &= P_{44}; \\ g22 &= \text{MEDIAN } (P_{44}, P_{35}, P_{55}, P_{46}); \\ g23 &= P_{56}; \\ g31 &= \text{MEDIAN } (P_{53}, P_{44}, P_{55}, P_{64}); \\ g32 &= P_{55}; \text{ and} \\ g33 &= \text{MEDIAN } (P_{46}, P_{57}, P_{55}, P_{66}). \end{aligned}\right\} \quad (2)$$

In this exemplary embodiment, the same kernel values are interpolated using median interpolation of actual sensed values of surrounding green pixels. The three by three interpolated kernel is green, in this exemplary embodiment, because as previously noted in a Bayer CFA, the green pixels are most prevalent and influential in the image. The values of pixels in the three by three kernel g11, g12, g13, g21, g22, g23, g31, g32, g33, illustrated in FIG. 4, are a calculation of the green values of the pixels in the three by three kernel illustrated in FIGS. 3A and 3B. The green kernel will be used during edge detection and in the calculation of the correction terms. One of ordinary skill in the art would appreciate that other pixel colors may be used to calculate the three by three interpolated kernel or that the kernel may be of a different size.

Next in step 711, illustrated in FIG. 7, the calculated three by three green kernel is used to determine an edge direction. The values of four edge directions are calculated in step 711. Dashed lines 2, 5, 8, and 11, illustrated in FIG. 4, are the four directions for which edge direction calculations are done. The remaining dashed lines 1, 3, 4, 6, 7, 9, 10, and 12 are only exemplary for use in calculating the four edge direction values. The sum of each dashed line is calculated in equation set (3) below:

$$\left.\begin{aligned}S1 &= g11 + g12 + g13; \\ S2 &= g21 + g22 + g23; \\ S3 &= g31 + g32 + g33; \\ S4 &= g11 + g21 + g31; \\ S5 &= g12 + g22 + g32; \\ S6 &= g13 + g23 + g33; \\ S7 &= g21 + g11 + g12); \\ S8 &= g13 + g22 + g31; \\ S9 &= g23 + g32 + g33; \\ S10 &= g21 + g31 + g32; \\ S11 &= g11 + g13 + g33; \text{ and} \\ S12 &= g12 + g13 + g23. \end{aligned}\right\} \quad (3)$$

The edge direction value $DIR_x$, where "DIR" is the value and "x" is the direction line number, is calculated for each of the direction lines 2, 5, 8, and 11. The following set of equations (4) are used to calculate the four edge direction values:

$$\left.\begin{aligned}DIR_2 &= \max(|S1-S2|, |S2-S3|); \\ DIR_5 &= \max(|S4-S5|, |S5-S6|); \\ DIR_8 &= \max(|S7-S8|, |S8-S9|); \text{ and} \\ DIR_{11} &= \max(|S10-S11|, |S11-S12|). \end{aligned}\right\} \quad (4)$$

The direction having the greatest DIR value is determined to be the edge direction and is determined in step 711.

Next in step 713 illustrated in FIG. 7, it is determined if pixel 45 undergoing processing is green. If the pixel 45 is not green, in step 713, it is determined whether the edge direction was in the direction of line 2 (horizontal) in step 714. If the edge direction was horizontal, g22 is recalculated to account for the edge direction, illustrated in FIG. 3B. The value of g22 is recalculated using the equation g22=(g21+g23)/2. If in step 714, the edge direction is not horizontal, it is next determined if the edge direction was in the direction of line 5 (vertical) in step 715. If the direction was determined to be in vertical direction the pixel value of g22 is recalculated using the equation g22=(g12+g32)/2. However, if in step 715 the edge direction was not vertical, the value of g22 remains unchanged in step 719. If in step 713 the pixel was determined to be green, the value of g22 remains unchanged.

Next, in order to determine if an edge is present for processed pixel 45, difference values are calculated between pairs of the same color pixels for all of the pixels that may be used in calculating the interpolated values. In step 723 if processed pixel 45 is green, the difference values are calculated in step 725 according to equation set (5) below:

$$\left.\begin{aligned}D_1 &= |P_{54} - P_{36}|; \\ D_2 &= |P_{45} - P_{47}|; \\ D_3 &= |P_{35} - P_{57}|; \\ D_4 &= |P_{44} - P_{66}|; \\ D_5 &= |P_{55} - P_{37}|; \text{ and} \\ D_6 &= |P_{64} - P_{46}| \end{aligned}\right\} \quad (5)$$

If it is determined in step 723 that the processed pixel 45 is not green, the difference values are calculated in step 727 according to equation set (6) below:

$$\left.\begin{aligned}D_1 &= |P_{54} - P_{36}|; \\ D_2 &= |P_{56} - P_{34}|; \\ D_3 &= |P_{46} - P_{44}|; \\ D_4 &= |P_{55} - P_{35}|; \\ D_5 &= |P_{45} - P_{43}|; \\ D_6 &= |P_{45} - P_{47}|; \text{ and} \\ D_7 &= |P_{45} - P_{65}|. \end{aligned}\right\} \quad (6)$$

In step 729, it is determined whether the maximum difference value among the calculated difference values is greater than a predetermined edge threshold value using an equation (7):

$$\text{MAX}(D_1 \ldots D_7) > \text{Edge Threshold}. \quad (7)$$

If the maximum difference value is less than the threshold, no edge is identified as present (step 731), however, if the maximum difference value is greater than the threshold, an edge is identified as present (step 733). The edge threshold may be set to be application specific or set based on a user's preferences.

If no edge is detected in step 729, it is again determined if processed pixel 45 is green. If processed pixel 45 is green, in step 739 a eighth set (8) of equations is used to calculated the interpolated red, green and blue values of pixel 45. The eighth set (8) of interpolation equations is:

$$R_{45} = (P_{35} + P_{55} + P_{37} + P_{57})/4;$$
$$B_{45} = (P_{44} + P_{46} + P_{66} + P_{64})/=4; \text{ and} \quad (8)$$
$$G_{45} = (P_{45} + P_{47} + P_{54} + P_{36})/4,$$

where $R_{45}$, $G_{45}$, and $B_{45}$ are the red, green and blue interpolated values for processed pixel 45. Note that even though pixel 45 is a green pixel, the value is interpolated using the actual sensed value of $P_{45}$ as well as the actual values of other green pixel around it.

If in step 735 it is determined that processed pixel 45 is not green, in step 741 it is determined if processed pixel 45 is blue. If processed 45 is blue, a ninth (9) set of equations is used to calculate the red, green and blue values of pixel 45 in step 747. The ninth set of equations interpolation is:

$$R_{45} = (P_{56} + P_{54} + P_{36} + P_{34})/4;$$
$$B_{45} = (P_{45} + P_{43} + P_{47} + P_{65})/4; \text{ and} \quad (9)$$
$$G_{45} = (P_{44} + P_{35} + P_{46} + P_{55})/4,$$

where $R_{45}$, $G_{45}$, and $B_{45}$ are the red, green and blue interpolated values for pixel 45. If in step 741, processed pixel 45 is not blue, pixel 45 is red and a tenth (10) set of equations is used to calculate the red, green and blue values of pixel 45 in step 749. The tenth set of interpolation equations is:

$$R_{45} = (P_{45} + P_{43} + P_{47} + P_{65})/4;$$
$$B_{45} = (P_{56} + P_{54} + P_{36} + P_{34})/4; \text{ and} \quad (10)$$
$$G_{45} = (P_{44} + P_{35} + P_{46} + P_{55})/4.$$

where $R_{45}$, $G_{45}$, and $B_{45}$ are the red, green and blue interpolated values for pixel 45.

If an edge was detected in step 729 and processed pixel 45 is green in step 734, the interpolation values of the red, green and blue values of pixel 45 are calculated using an eleventh (11) set of equations. The eleventh set of interpolation equations is:

$$R_{45}=(P_{35}+P_{55})/2+\text{DELTA}_{red};$$
$$B_{45}=(P_{44}+P_{46})/2+\text{DELTA}_{blue}; \text{ and}$$
$$G_{45}=g22,$$

where $R_{45}$, $G_{45}$, and $B_{45}$ are the red, green and blue interpolated values for pixel 45 and DELTAblue and DELTAred are correction terms. The values of DELTAblue and DELTAred are calculated based on which direction the edge was determined to be in step 711. If the edge direction is in the horizontal line 2 direction, DELTAblue=g22−(g21+g23)/2 and DELTAred=0 and if the edge direction is determine to be vertical line 5 direction, DELTAblue=0 and DELTAred=g22−(g12+g32)/2. Lastly, if the edge direction is determined to be in a diagonal direction 11 or 8, DELTAblue=g22−(g21+g23)/2 and DELTAred=g22−(g12+g32)/2.

If in step 734 it is determined that processed pixel 45 is not green, in step 745 it is determined if the processed pixel 45 is blue. If processed pixel 45 is blue, a twelfth (12) set of equations is equations is used in step 751 to calculate the red, green and blue interpolation values. The twelfth set of interpolation equations is:

$$R_{45}=(P_{56}+P_{54}+P_{36}+P_{34})/4+\text{DELTA}_{red};$$
$$B_{45}=P_{45}; \text{ and}$$
$$G_{45}=g22,$$

where $R_{45}$, $G_{45}$, and $B_{45}$ are the red, green and blue interpolated values for pixel 45 and the value of DELTAred is calculated using the equation DELTAred=g22−(g11+g13+g31+g33)/4. If in step 745, processed pixel 45 is not blue, a thirteenth (13) set of equations is used to calculate the red, green and blue values for red processed pixel 45 in step 753. The thirteenth set of interpolation equations is:

$$B_{45}=(P_{56}+P_{54}+P_{36}+P_{34})/4+\text{DELTA}_{blue};$$
$$R_{45}=P_{45}; \text{ and}$$
$$G_{45}=g22,$$

where $R_{45}$, $G_{45}$, and $B_{45}$ are the red, green and blue interpolated values for pixel 45 and the value of DELTAblue is calculated using the equation DELTAblue=g22−(g11+g13+g31+g33)/4). The DELTA correction values for the red and blue pixels are based on the edge direction and the green three by three interpolated kernel.

As described, the invention provides a new and novel system and method for color plane interpolation, in which interpolated values for green, red and blue are calculated based on not only the sensed values obtained but also whether a processed pixel is at an image edge. According to the invention, the imbalance between sensed values and interpolated values is removed by interpolating the values for each of the colors. Further, edge detection and correction terms are utilized to minimize blurring of image edges.

Figure 5:
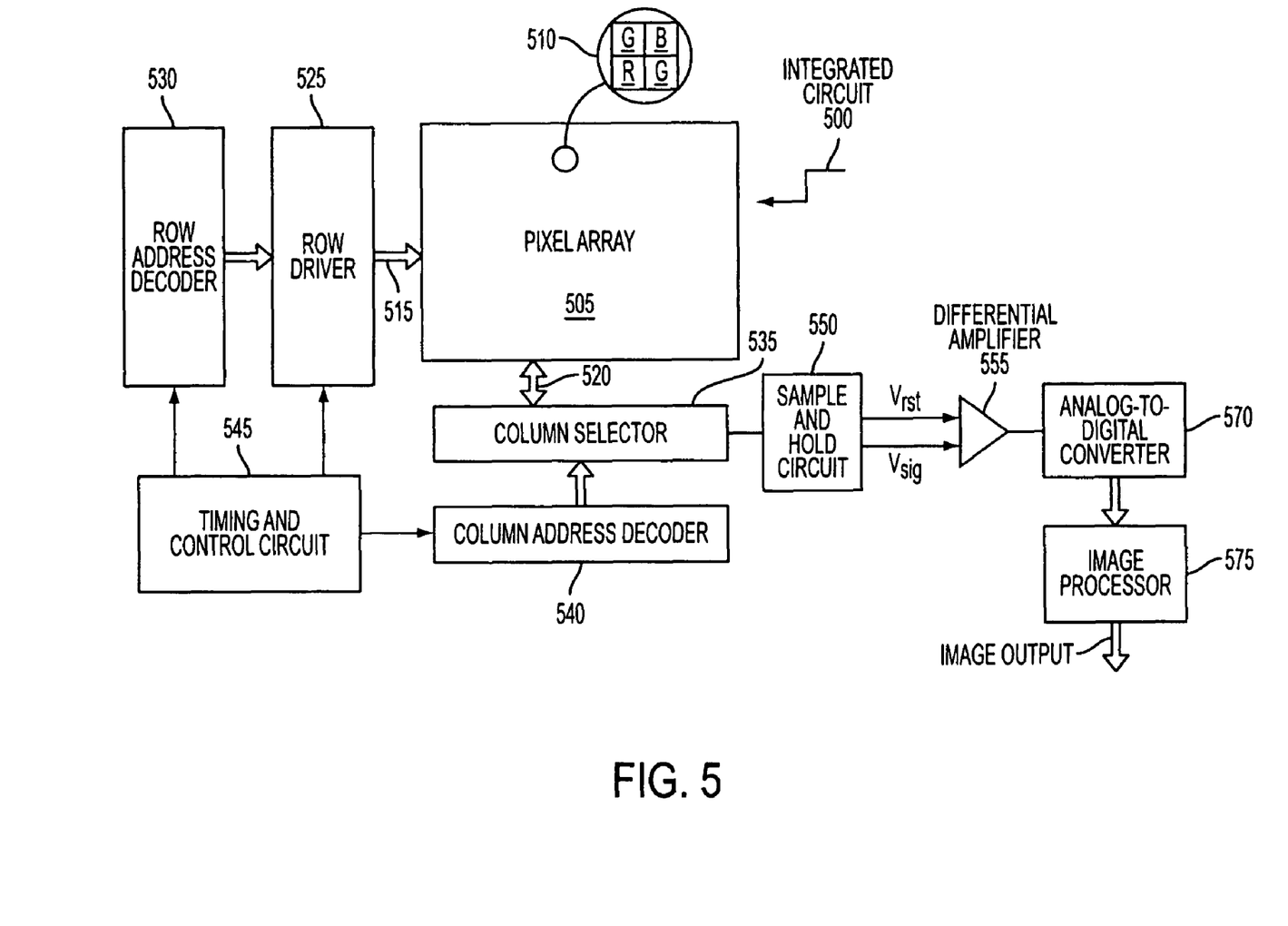
FIG. 5 is a block diagram of a CMOS imager integrated circuit (IC) having a pixel array constructed according to an exemplary embodiment of the invention.

FIG. 5 illustrates a block diagram of a CMOS imager integrated circuit (IC) 500 having a pixel array 505 containing a plurality of pixels arranged in rows and columns, including a region 510 with, for example, two green pixels (G), one blue pixel (B), and one red pixel (R) arranged in a Bayer pattern. The pixels of each row in array 505 are all turned on at the same time by row select lines 515, and the pixels of each column are selectively output by respective column select lines 520.

The row lines 515 are selectively activated by a row driver 525 in response to row address decoder 530. The column select lines 520 are selectively activated by a column selector 535 in response to column address decoder 540. The pixel array 505 is operated by the timing and control circuit 545, which controls address decoders 530, 540 for selecting the appropriate row and column lines for pixel signal readout.

The pixel column signals, which typically include a pixel reset signal ($V_{rst}$) and a pixel image signal ($V_{sig}$), are read by a sample and hold circuit 550 associated with the column selector 535. A differential signal ($V_{rst}-V_{sig}$) is produced by differential amplifier 555 for each pixel that is amplified and digitized by analog-to-digital converter 570 (ADC). The analog-to-digital converter 570 supplies the digitized pixel signals to an image processor 575, which performs the processing method 700 of the invention. Alternatively, image processor 575 can output an image file in a raw format as received from the analog-to-digital converter 570 which can be received and processed in accordance with the invention by a different processor.

Figure 6:
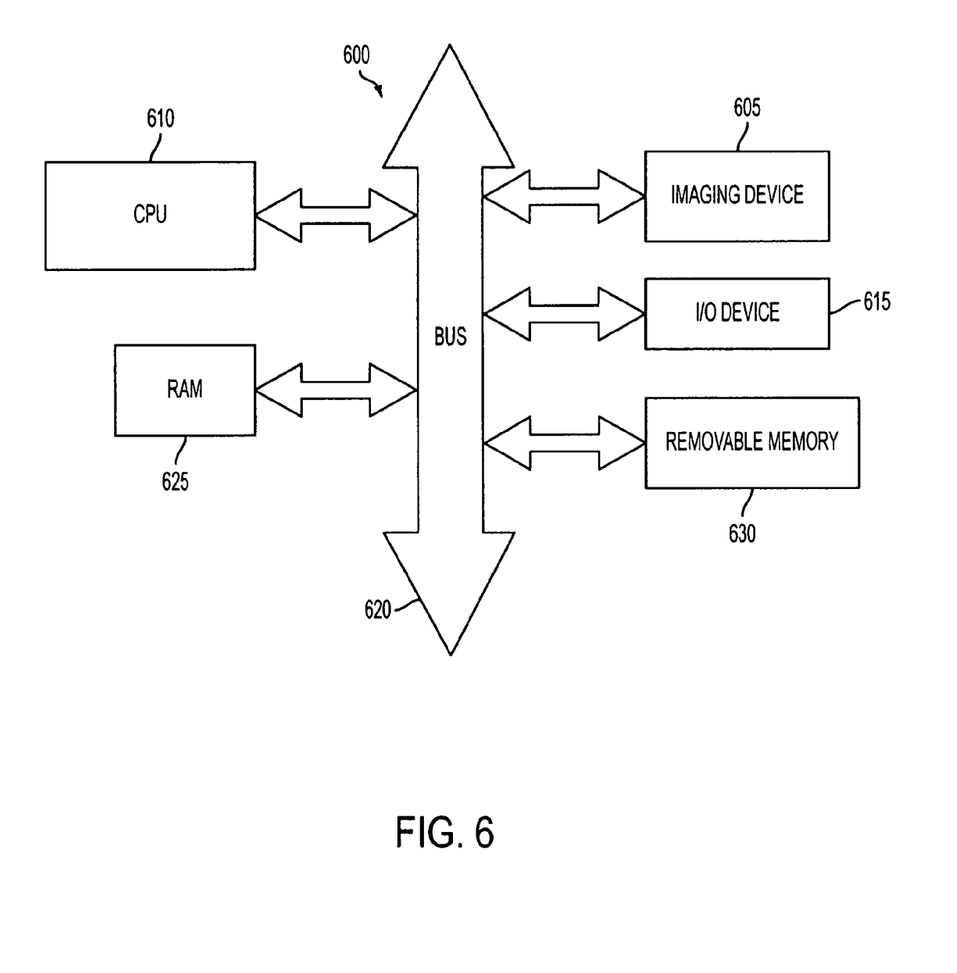
FIG. 6 is an illustration of a processor system having a CMOS imager according to the present invention.

A typical processor system which includes an imager device 605 having a pixel array in which the pixels signals are interpolated according to the present invention is illustrated generally at 600 in FIG. 6. The imager device 605 produces an output image from signals supplied from the pixel array. A processor system is exemplary of a system receiving the output of a CMOS imager device. Without being limiting, such a system could include a computer system, camera system, scanner, machine vision system, medical sensor system (such as medical pill sensors), and automotive diagnostic system, and other imaging systems, all of which can utilize the present invention. Alternatively, if the image processor 575 in the imager device 605 provides a progressed image signal, the invention can performed in the processing system 600.

A processor system 600, such as a computer system, for example generally comprises a central processing unit (CPU) 610, for example, a microprocessor, that communicates with an input/output (I/O) device 615 over a bus 620. The imager device 605 also communicates with the system over bus 620 or other communication link. The processor-based system 600 also includes random access memory (RAM) 625, and can include removable memory 630, such as flash memory, which also communicates with the CPU 610 over the bus 620. The imaging device 600 may be combined with a processor, such as a CPU, digital signal processor, or microprocessor, with or without memory storage on a single integrated circuit or on a different chip than the processor.

The invention is not restricted to the above described embodiments. For example, a program embodying the processing method may be stored on a carrier medium which may include RAM, floppy disk, data transmission, compact disk, etc. and then be executed by an associated processor which receives and processes an image file in accordance with the invention or the processing method may be embodied in a circuit or a combination thereof. Additionally, the invention may be implemented as a plug-in for existing software applications or it may used on its own. The invention is not limited to the carrier mediums specified herein and the invention may be implemented using any carrier medium as known in the art.

It should be understood that other methods of interpolating the values for the green, red and blue colors of the pixels are within the scope of the invention, and the invention is in not limited to the equations or use of the correction terms described above. Specifically, for example, other surrounding pixels may be used in calculating the interpolated values instead or in addition to those discussed herein. As such, the above description and drawings are only to be considered illustrative of an exemplary embodiment which achieves the features and advantages of the invention. Any modification of the present invention which comes within the spirit and scope of the following claims should be considered part of the invention. Accordingly, the invention is not to be considered as being limited by the foregoing description and drawings, but is only limited by the scope of the appended claims.

What is claimed as new and desired to be protected by Letters Patent of the United States is:

1. A method of color plane interpolation for image pixels being carried out by a processor using pixel values output by a color imager, said method comprising the steps of:
    selecting a pixel of the color imager for processing;
    forming a kernel of neighboring pixels associated with said selected pixel;
    calculating pixel values of one color of a color pattern for all of the pixels in said kernel;
    determining at least three edge direction values, the three edge direction values respectively represent a horizontal edge direction, a vertical edge direction and a diagonal edge direction;
    determining whether said selected pixel is at an edge within an image and the direction of such edge using said calculated kernel pixel values of said one color and based on the edge direction values, wherein the direction of the edge is determined as the edge direction value having the maximum absolute value;
    recalculating at least one pixel value in said kernel based on said determined edge direction, wherein said recalculating said at least one pixel value is performed only if the edge direction is determined to be horizontal or vertical; and
    generating a value for said selected pixel for each color of said color pattern based on said neighboring pixels, whether said selected pixel is at said edge and the direction of said edge, wherein when said selected pixel is determined to be at said edge, at least one of said generated values is generated based on at least one correction term, said at least one correction term calculated based on the direction of said edge and pixel values of said neighboring pixels.

2. The method of claim 1, wherein said color pattern is a Bayer pattern.

3. The method of claim 1, wherein said one color is green.

4. The method of claim 1, wherein said determining whether said selected pixel is at an edge within an image comprises:
    calculating difference values between different pairs of pixels of a same color; and
    comparing a largest difference value to a predetermined threshold value.

5. The method of claim 4, wherein said pairs of pixels include said selected pixel.

6. A color imaging device including a sensing array of image pixel sensors, said device comprising:
    a first plurality of image pixel sensors that are used to produce sensed values of a first color;
    a second plurality of image pixel sensors that are used to produce sensed values of a second color;
    a third plurality of image pixel sensors that are used to produce sensed values of a third color;
    interpolation means for using said sensed values of the first color to determine a first set of pixel values for a plurality of image pixels in a pixel kernel, including a selected pixel and neighboring pixels, for said first color, determining at least three edge direction values using said first set of pixel values, the three edge direction values respectively represent a horizontal edge direction, a vertical edge direction and a diagonal edge direction, determining an edge direction of the selected pixel based on the edge direction values, determining whether an edge is present for said selected pixel, and calculating interpolation values for said first, second and third colors of said selected pixel based on said first set of pixel values for said first color, neighboring pixels and said edge direction, wherein, when an edge is present and said selected pixel is from the second or third plurality of image pixel sensors, said calculated interpolation values for at least one of said second and third colors are calculated based on at least one correction term, said at least one correction term calculated based on said first set of pixel values and said edge direction; and means for creating a representative image using interpolated values of said first, second and third colors.

7. The color imaging device of claim 6, wherein at least one value of said pixel kernel is recalculated based on said edge direction before said interpolation values are calculated.

8. The color imaging device of claim 6, wherein said pixel kernel is a three by three kernel of pixels.

9. A color imaging device including a sensing array of image pixel sensors, said device comprising:
a first plurality of image pixel sensors that are used to produce sensed values of a first color;
a second plurality of image pixel sensors that are used to produce sensed values of a second color;
a third plurality of image pixel sensors that are used to produce sensed values of a third color; and
interpolation means for using said sensed values of the first color to determine a first set of pixel values for a plurality of image pixels in a pixel kernel, including a selected pixel and neighboring pixels, for said first color, determining whether an edge is present for said selected pixel using said kernel values and calculating interpolation values for said first, second and third colors of said selected pixel based on said kernel values, neighboring pixels and an edge direction; and
means for creating a representative image using interpolated values of said first, second and third colors,
wherein said interpolation means further determines whether said selected pixel is at said edge, and
wherein said edge directions are calculated as follow:

$$DIR_{horizontal} = \max(|S1-S2|, |S2-S3|);$$

$$DIR_{vertical} = \max(|S4-S5|, |S5-S6|);$$

$$DIR_{diagonal1} = \max(|S7-S8|, |S8-S9|); \text{ and}$$

$$DIR_{diagonal2} = \max(|S10-S11|, |S11-S12|),$$

where S1, S2, S3, S4, S5, S6, S7, S8, S9, S10, S11 and S12 are calculated as follows:

$$S1 = g11 + g12 + g13$$

$$S2 = g21 + g22 + g23$$

$$S3 = g31 + g32 + g33;$$

$$S4 = g11 + g21 + g31;$$

$$S5 = g12 + g22 + g32;$$

$$S6 = g13 + g23 + g33;$$

$$S7 = g21 + g11 + g12;$$

$$S8 = g13 + g22 + g31;$$

$$S9 = g23 + g32 + g33;$$

$$S10 = g21 + g31 + g32;$$

$$S11 = g11 + g22 + g33; \text{ and}$$

$$S12 = g12 + g13 + g23,$$

using said kernel where g11, g12, and g13 are the pixel values of the first row of said kernel, g21, g22, and g23 are the pixel values of the second row of said kernel and g31, g 32, and g33 are the pixel values of the third row of the kernel and wherein said edge direction is the direction having the greatest value.

10. The color imaging device of claim 6, wherein said edge is detected by calculating difference values of neighboring pixels and comparing a maximum difference value to an edge threshold.

11. The color imaging device of claim 10, wherein said difference values are calculated as follows when said selected pixel is green:

$$D_1 = |P_{x+1,y-1} - P_{x-1,y+1}|;$$

$$D_2 = |P_{x,y} - P_{x,y+2}|;$$

$$D_3 = |P_{x-1,y} - P_{x+1,y+2}|;$$

$$D_4 = |P_{x,y-1} - P_{x+2,y+1}|;$$

$$D_5 = |P_{x+1,y} - P_{x-1,y+2}|; \text{ and}$$

$$D_6 = |P_{x+2,y-1} - P_{x,y+1}|,$$

where $P_{x,y}$ is the selected pixel and the "x" relates to the row in which the pixel is relative to the selected pixel $P_{x,y}$ and "y" relates to the column in which the pixel is relative to the selected pixel $P_{x,y}$.

12. The color imaging device of claim 10, wherein said difference values are calculated as follows when said selected pixel is red or blue:

$$D_1 = |P_{x+1,y-1} - P_{x-1,y+1}|;$$

$$D_2 = |P_{x+1,y+1} - P_{x-1,y-1}|;$$

$$D_3 = |P_{x,y+1} - P_{x,y-1}|;$$

$$D_4 = |P_{x+1,y} - P_{x-1,y}|;$$

$$D_5 = |P_{x,y} - P_{x,y-2}|;$$

$$D_6 = |P_{x,y} - P_{x,y+2}|; \text{ and}$$

$$D_7 = |P_{x,y} - P_{x+2,y}|,$$

where $P_{x,y}$ is the selected pixel and the "x" relates to the row in which the pixel is relative to the selected pixel $P_{x,y}$ and "y" relates to the column in which the pixel is relative to the selected pixel $P_{x,y}$.

13. The color imaging device of claim 8, wherein said three by three kernel is calculated, when said pixel is green, as follows:

$$g11 = P_{x-1,y-1};$$

$$g12 = \text{MEDIAN}(P_{x-2,y}, P_{x-1,y-1}, P_{x,y}, P_{x,y+1});$$

$$g13 = P_{x-1,y+1};$$

$$g21 = \text{MEDIAN}(P_{x+1,y+1}, P_{x,y+2}, P_{x,y}, P_{x-1,y+1});$$

$$g22 = P_{x,y};$$

$$g23 = \text{MEDIAN}(P_{x+1,y+1}, P_{x+2,y}, P_{x,y}, P_{x+1,y-1});$$

$$g31 = P_{x+1,y-1};$$

$$g32 = \text{MEDIAN}(P_{x,y-2}, P_{x-1,y-1}, P_{x,y}, P_{x+1,y-1}); \text{ and}$$

$$g33 = P_{x+1,y+1},$$

where $P_{x,y}$ is the selected pixel and the "x" relates to the row in which the pixel is relative to the selected pixel $P_{x,y}$ and "y" relates to the column in which the pixel is relative to the selected pixel $P_{x,y}$.

14. The color imaging device of claim 8, wherein said three by three kernel is calculated, when said pixel is red or blue, as follows:

$g11=\text{MEDIAN}(P_{x-1,y-2},P_{x-2,y-1},P_{x-1,y},P_{x,y-1});$ $g12=P_{x-1,y};$ $g13=\text{MEDIAN}(P_{x-2,y+1},P_{x-1,y+2},P_{x-1,y},P_{x,y+1});$ $g21=P_{x,y-1};$ $g22=\text{MEDIAN}(P_{x,y-1},P_{x-1,y},P_{x+1,y},P_{x,y+1});$ $g23=P_{x+1,y+1};$ $g31=\text{MEDIAN}(P_{x+1,y-2},P_{x,y-1},P_{x,y+1},P_{x+2,y-1});$ $g32=P_{x+1,y};$ and $g33=\text{MEDIAN}(P_{x,y+1},P_{x+1,y+2},P_{x+1,y},P_{x+2,y+1}),$ where $P_{x,y}$ is the selected pixel and the "x" relates to the row in which the pixel is relative to the selected pixel $P_{x,y}$ and "y" relates to the column in which the pixel is relative to the selected pixel $P_{x,y}$.

15. The color imaging device of claim 6, wherein said calculated interpolation values for said first, second and third colors of said selected pixel are calculated as follows when said selected pixel is green and no edge is present:

$R_{x,y}=(P_{x-1,y}+P_{x+1,y}+P_{x-1,y+2}+P_{x+1,y+2})/4;$ $B_{x,y}=(P_{x,y-1}+P_{x,y+1}+P_{x+2,y+1}+P_{x+2,y-1})/4;$ and $G_{x,y}=(P_{x,y}+P_{x,y+2}+P_{x+1,y-1}+P_{x-1,y+1})/4,$ where $P_{x,y}$ is the selected pixel and the "x" relates to the row in which the pixel is relative to the selected pixel $P_{x,y}$ and "y" relates to the column in which the pixel is relative to the selected pixel $P_{x,y}$.

16. The color imaging device of claim 6, wherein said calculated interpolation values for said first, second and third colors of said selected pixel are calculated as follows when said selected pixel is blue and no edge is present:

$R_{x,y}=(P_{x+1,y+1}+P_{x+1,y-1}+P_{x-1,y+1}+P_{x-1,y-1})/4;$ $B_{x,y}=(P_{x,y}+P_{x,y-2}+P_{x,y+2}+P_{x+2,y})/4;$ and $G_{x,y}=(P_{x,y-1}+P_{x-1,y}+P_{x,y+1}+P_{x+1,y})/4,$ where $P_{x,y}$ is the selected pixel and the "x" relates to the row in which the pixel is relative to the selected pixel $P_{x,y}$ and "y" relates to the column in which the pixel is relative to the selected pixel $P_{x,y}$.

17. The color imaging device of claim 6, wherein said calculated interpolation values for said first, second and third colors of said selected pixel are calculated as follows when said selected pixel is red and no edge is present:

$B_{x,y}=(P_{x+1,y+1}+P_{x+1,y-1}+P_{x-1,y+1}+P_{x-1,y-1})/4;$ $R_{x,y}=(P_{x,y}+P_{x,y-2}+P_{x,y+2}+P_{x+2,y})/4;$ and $G_{x,y}=(P_{x,y-1}+P_{x-1,y}+P_{x,y+1}+P_{x+1,y})/4,$ where $P_{x,y}$ is the selected pixel and the "x" relates to the row in which the pixel is relative to the selected pixel $P_{x,y}$ and "y" relates to the column in which the pixel is relative to the selected pixel $P_{x,y}$.

18. The color imaging device of claim 6, wherein said calculated interpolation values for said first, second and third colors of said selected pixel are calculated as follows when said selected pixel is green and an edge is present:

$R_{x,y}=(P_{x-1,y}+P_{x+1,y})/2+\text{DELTA}_{red};$ $B_{x,y}=(P_{x,y-1}+P_{x,y+1})/2+\text{DELTA}_{blue};$ and $G_{x,y}=g22,$ where g22, and correction terms $\text{DELTA}_{red}$ and $\text{DELTA}_{blue}$ are calculated based on said kernel values and based on said edge direction, and where $P_{x,y}$ is the selected pixel and the "x" relates to the row in which the pixel is relative to the selected pixel $P_{x,y}$ and "y" relates to the column in which the pixel is relative to the selected pixel $P_{x,y}$.

19. The color imaging device of claim 6, wherein said calculated interpolation values for said first, second and third colors of said selected pixel are calculated as follows when said selected pixel is blue and an edge is present:

$R_{x,y}=(P_{x+1,y+1}+P_{x+1,y-1}+P_{x-1,y+1}+P_{x-1,y-1})/4+\text{DELTA}_{red};$ $B_{x,y}=P_{x,y};$ and $G_{x,y}=g22,$ where g22 and correction term $\text{DELTA}_{red}$ are calculated based on said kernel values and based on said edge direction, and where $P_{x,y}$ is the selected pixel and the "x" relates to the row in which the pixel is relative to the selected pixel $P_{x,y}$ and "y" relates to the column in which the pixel is relative to the selected pixel $P_{x,y}$.

20. The color imaging device of claim 6, wherein said calculated interpolation values for said first, second and third colors of said selected pixel are calculated as follows when said selected pixel is red and an edge is present:

$B_{x,y}=(P_{x+1,y+1}+P_{x+1,y-1}+P_{x-1,y+1}+P_{x-1,y-1})/4+\text{DELTA}_{red};$ $R_{x,y}=P_{x,y};$ and $G_{x,y}=g22,$ where g22 and $\text{DELTA}_{red}$ are calculated based on said kernel values and based on said edge direction, and where $P_{x,y}$ is the selected pixel and the "x" relates to the row in which the pixel is relative to the selected pixel $P_{x,y}$ and "y" relates to the column in which the pixel is relative to the selected pixel $P_{x,y}$.

21. A processing system comprising:
an imaging device including an array of image pixel sensors, said device comprising:
 a first plurality of image pixel sensors that are used to produce sensed values of a first color;
 a second plurality of image pixel sensors that are used to produce sensed values of a second color;
 a third plurality of image pixel sensors that are used to produce sensed values of a third color;
 interpolation processing circuit for using said sensed values of the first color to determine a first set of pixel values for a plurality of image pixels in a pixel kernel, including a selected pixel and neighboring pixels, for said first color, determining at least three edge direction values using said first set of pixel values, wherein the three edge direction values respectively represent a horizontal edge direction, a vertical edge direction and a diagonal edge direction, determining whether an edge is present for said selected pixel, determining an edge direction of the selected pixel based on the edge direction values, and calculating interpolation values for said first, second and third colors of said selected pixel based on said first set of pixel values, neighboring pixels and said edge direction of said selected pixel, wherein, when an edge is present for said selected pixel and said selected pixel is from the second or third plurality of image pixel sensors, said calculated interpolation values for at least one of said second and third colors are calculated based on at least one correction term, said at least one correction term calculated based on said first set of pixel values and said edge direction.

22. The processing system of claim 21, wherein at least one value of said pixel kernel is recalculated based on said edge direction.

23. A method of processing a digital color signal being carried out by an image processor using sensed values obtained from a sensing array of pixel sensors of a color imaging device, the method comprising the acts of:

obtaining a sensed value from each of said pixel sensors, said pixel sensors corresponding to applied light with wavelengths in one of a red, blue and green spectrum; and interpolating a red value, a blue value and a green value for each of said plurality of pixel sensors based on edge detection, wherein said interpolation of said red, green and blue values comprises:

calculating a green kernel of interpolation values using pixel values of neighboring green pixel sensors for each of said pixel sensors, determining at least three edge direction values for each of said pixel sensors using said green kernel of interpolation values, wherein the three edge direction values respectively represent a horizontal edge direction, a vertical edge direction and a diagonal edge direction, determining said edge direction for each of said pixel sensors as the edge direction value having the maximum absolute value, and calculating said interpolation values for each of said pixel sensors based on pixel values of neighboring pixel sensors, said green kernel of interpolation values, whether said respective pixel sensor is at an edge, and said determined edge direction.

24. The method of claim 23, wherein said step of determining whether said pixel is at an edge comprises:

calculating difference values between different pairs of neighboring pixels of a same color; and comparing the largest difference value to a predetermined threshold value.

25. A non-transitory computer readable medium for storing computer instructions for enabling a computer to perform color plane interpolation for a color pattern including the steps of:

obtaining a sensed value from each of a plurality of pixel sensors, the plurality of pixel sensors corresponding to applied light with wavelengths in one of red, blue and green spectrum; and interpolating a red value, a blue value and a green value for each of said plurality of pixel sensors based on edge detection, wherein said interpolation of said red, green and blue values comprises:

calculating a green kernel of interpolation values using pixel values of neighboring green pixel sensors for each of said pixel sensors, determining at least three edge direction values for each of said pixel sensors using said green kernel of interpolation values, wherein the three edge direction values respectively represent a horizontal edge direction, a vertical edge direction and a diagonal edge direction, determining said edge direction for each of said pixel sensors as the edge direction value having the maximum absolute value, and calculating said interpolation values for each of said pixel sensors based on pixel values of neighboring pixel sensors, said green kernel of interpolation values, whether said respective pixel sensor is at an edge, and said determined edge direction.

26. The medium of claim 25, wherein said step of determining whether each of said pixel sensors are at an edge comprises:

calculating difference values between different pairs of neighboring pixels of a same color; and comparing difference values between different pairs of neighboring pixels of a same color; and comparing the largest difference value to a predetermined threshold value.

27. A method of color plane interpolation for a selected pixel of a pixel array being carried out by a processor using pixel values output by a color imager, said method comprising:

determining whether said selected pixel is at an image edge;

using sensed values of a first color to determine a first set of pixel values for a plurality of pixels in a pixel kernel of the pixel array, including said selected pixel and neighboring pixels, for said first color;

if said selected pixel is at said edge, determining at least three edge direction values using said first set of pixel values for said first color, wherein the three edge direction values respectively represent a horizontal edge direction, a vertical edge direction and a diagonal edge direction, determining the direction of the edge based on the edge direction values, and calculating pixel values for each color of a color pattern based on said first set of pixel values for said first color, neighboring pixels and a first set of parameters corresponding to the edge direction, wherein, when said selected pixel is associated with a sensed value of a second color or a third color of said color pattern, said calculated pixel values for at least one of said second and third colors are calculated based on said first set of pixel values and said edge direction; and if said selected pixel is not at said edge, calculating pixel values for each color of said color pattern based on said neighboring pixels using a second set of parameters.

28. The method of claim 27, wherein said first and second set of parameters are based on the color of said selected pixel.

29. The method of claim 27, wherein said color pattern is a Bayer color pattern.

30. The method of claim 29, wherein said first set of parameters is comprised of a third set of parameters for green pixels, a fourth set of parameters for blue pixels and a fifth set of parameters for red pixels.

31. The method of claim 29, wherein said second set of parameters is comprised of a sixth set of parameters for green pixels, a seventh set of parameters for blue pixels and an eighth set of parameters for red pixels.

32. The color imaging device of claim 18, wherein, if said edge direction is horizontal, the correction terms are calculated as follows:

$$DELTA_{red}=0, \text{ and}$$

$$DELTA_{blue}=g22-(g21+g23)/2,$$

where $g22=P_{x,y}$, g21 is calculated based on $P_{x-1,y+1}$, $P_{x,y}$, $P_{x,y+2}$, $P_{x+1,y+1}$, and g23 is calculated based on $P_{x+1,y+1}$, $P_{x+2,y}$, $P_{x,y}$, $P_{x+1,y-1}$.

33. The color imaging device of claim 18, wherein if said edge direction is vertical, the correction terms are calculated as follows:

$$DELTA_{blue}=0, \text{ and}$$

$$DELTA_{red}=g22-(g12+g32)/2,$$

where $g22=P_{x,y}$, g12 is calculated based on $P_{x-2,y}$, $P_{x-1,y-1}$, $P_{x,y}$, $P_{x-1,y+1}$, and g32 is calculated based on $P_{x,y-2}$, $P_{x-1,y-1}$, $P_{x,y}$, $P_{x+1,y-1}$.

34. The color imaging device of claim 18, wherein if said edge direction is first or second diagonal edge directions, the correction terms are calculated as follows:

$$DELTA_{blue}=g22-(g21+g23)/2, \text{ and}$$

$$DELTA_{red}=g22-(g12+g32)/2,$$

where $g22=P_{x,y}$, g21 is calculated based on $P_{x-1,y+1}$, $P_{x,y}$, $P_{x,y+2}$, $P_{x+1,y+1}$, g23 is calculated based on $P_{x+1,y+1}$, $P_{x+2,y}$, $P_{x,y}$, $P_{x+1,y-1}$, g12 is calculated based on $P_{x-2,y}$, $P_{x-1,y-1}$, $P_{x,y}$, $P_{x-1,y+1}$, and g32 is calculated based on $P_{x,y-2}$, $P_{x-1,y-1}$, $P_{x,y}$, $P_{x+1,y-1}$.

\* \* \* \* \*

UNITED STATES PATENT AND TRADEMARK OFFICE
CERTIFICATE OF CORRECTION

| | | |
|---|---|---|
| PATENT NO. | : 7,830,426 B2 | Page 1 of 1 |
| APPLICATION NO. | : 11/319398 | |
| DATED | : November 9, 2010 | |
| INVENTOR(S) | : Igor Subbotin | |

It is certified that error appears in the above-identified patent and that said Letters Patent is hereby corrected as shown below:

On the Title page, Item (56), in column 2, under "Other Publications", line 1, delete ""Demosaicking" and insert -- "Demosaicing --, therefor.

On the Title page, Item (56), in column 2, under "Other Publications", line 12, delete ""Demosaicking:" and insert -- "Demosaicing: --, therefor.

In column 10, line 21, in claim 1, after "wherein" insert -- , --.

In column 11, line 65, in claim 9, delete "g 32," and insert -- g32, --, therefor.

In column 15, line 56, in claim 25, after "one of" insert -- a --.

In column 16, line 18-19, in claim 26, after "and" delete "comparing difference values between different pairs of neighboring pixels of a same color; and".

Signed and Sealed this
Eleventh Day of January, 2011

David J. Kappos
*Director of the United States Patent and Trademark Office*